United States Patent [19]

Tiemeijer et al.

[11] Patent Number: 5,737,352
[45] Date of Patent: Apr. 7, 1998

[54] SEMICONDUCTOR DIODE LASER, IN PARTICULAR A LASER AMPLIFIER, AND METHOD OF MANUFACTURING THIS LASER

[75] Inventors: Lukas F. Tiemeijer; Johannes J. M. Binsma; Petrus J. A. Thijs, all of Eindhoven, Netherlands

[73] Assignee: U.S. Philips Corporation, New York, N.Y.

[21] Appl. No.: 745,761

[22] Filed: Nov. 8, 1996

[30] Foreign Application Priority Data

Nov. 8, 1995 [EP] European Pat. Off. ............ 95203035

[51] Int. Cl.$^6$ ............................................. H01S 3/06
[52] U.S. Cl. ............................ 372/45; 359/344; 372/92
[58] Field of Search ........................... 359/344; 372/45, 372/46, 92

[56] References Cited

U.S. PATENT DOCUMENTS

| | | | |
|---|---|---|---|
| 4,432,091 | 2/1984 | Kuroda et al. | 372/45 |
| 4,856,014 | 8/1989 | Figueroa et al. | 372/45 |
| 4,901,123 | 2/1990 | Noguchi et al. | 372/45 |

FOREIGN PATENT DOCUMENTS

| | | | |
|---|---|---|---|
| 316291 | 1/1991 | Japan | 372/45 |
| 5-175611A | 7/1993 | Japan | H01S 3/18 |

Primary Examiner—John D. Lee
Assistant Examiner—Ellen Eunjoo Kang
Attorney, Agent, or Firm—Daniel E. Tierney

[57] ABSTRACT

The invention relates to a III–V laser (amplifier) with an active region (4A) which encloses a small angle with the end faces (50, 51), is separated therefrom by a preferably current-blocking cladding layer (5) and has a tapering end (40) of which a first side face (42) coincides with a side face (42) of the remainder of the strip-shaped active region (4A), while a second side face (43) thereof encloses an acute angle with the perpendicular to the end faces (50, 51). Such a laser has an amplification ripple, which is undesirable. In a laser according to the invention, the second side face (43) of the tapering portion (40) encloses an angle with the perpendicular to the end face (50, 51) which lies between 0° and 30°, preferably between 0° and 10°, and which is preferably approximately 0°. The laser according to the invention has a particularly low reflection, as a result of which said amplification ripple is absent or at least very small. No differences in growing processes against said side faces occur since both the first and the second side face (42, 43) of the active region (4A) are mutually substantially parallel. Accordingly, the laser is preferably of the buried hetero type. In that case, the growth around the active region (4A) is very homogeneous, which benefits the yield and quality of the lasers. The laser is preferably constructed as an amplifier, for which purpose the end faces (50, 51) are provided with an anti-reflection layer. The invention, finally, also relates to a method by which the desired laser is obtained in a simple manner.

14 Claims, 4 Drawing Sheets

SEMICONDUCTOR DIODE LASER, IN PARTICULAR A LASER AMPLIFIER, AND METHOD OF MANUFACTURING THIS LASER

BACKGROUND OF THE INVENTION

The invention relates to a semiconductor diode laser, in particular a semiconductor diode laser amplifier referred to as laser for short hereinafter, with a semiconductor body of III–V semiconductor materials comprising a substrate and an overlaying semiconductor layer structure with at least a first cladding layer of a first conductivity type, a second cladding layer of a second conductivity type opposed to the first, said cladding layers being provided with current supply means, and between the first and second cladding layers an active layer and a pn junction which, given a sufficient current strength in the forward direction, is capable of amplifying or generating electromagnetic radiation in a strip-shaped active region which forms part of the active layer, which lies within a resonance cavity formed between two parallel end faces, the longitudinal axis of said resonance cavity enclosing a small angle with the perpendicular to the end faces, and which has at least one end which is situated adjacent an end face and is separated from said end face by a third cladding layer which is preferably current-blocking and which is provided with a tapering portion, as seen in projection, of which a first side face coincides with a side face of the strip-shaped active region outside the tapering portion and of which a second side face encloses an acute angle with the perpendicular to the end face. Such a laser finds its application as a source or amplifier in optical registration or glass fiber communication systems. The term "laser" in the present application accordingly also covers a laser amplifier. The wavelength at which the laser operates may vary between approximately 0.5 and, for example, 1.5 μm. The invention also relates to a method of manufacturing such a laser.

Such a laser is known from the English abstract JP-A-5-175611 published under no. 62 E 1452 in Patent Abstracts of Japan, vol. 17, no. 583, 22 Oct. 1993. This abstract relates to a laser amplifier. To reduce the reflection at an end face of the radiation amplified or to be amplified, the strip-shaped active region encloses a small angle with the end faces which are preferably provided with an anti-reflection layer, also with the purpose of reducing this reflection. The ends of the active region lie at a certain distance from the end faces for the same reason and are separated therefrom by a cladding layer. The angle enclosed by said radiation and the end faces should be approximately equal to 90° outside the active region in order to couple the radiation amplified or to be amplified readily into a glass fiber. For this purpose, the active region is provided with a tapering end, seen in projection, of which a side face coincides with a side face of the active region outside the tapering end, while another side face encloses an angle with the perpendicular to the end faces which will lie between approximately 90° and approximately 60°. The value required for this angle depends on the angle enclosed by the longitudinal direction of the active region and the perpendicular to the end faces, and on the difference in reflective index between the active region and the (third) cladding layer: if the latter angle is approximately 0°, the former angle should be 90°); if the latter angle is approximately 20°—which is a maximum value in practice—, the value required for the former angle is approximately 60°.

A disadvantage of the known laser is that it has a too great amplification ripple, i.e. the amplification is not constant in the case of minor variations in the wavelength to be amplified. This is undesirable.

SUMMARY OF THE INVENTION

The present invention has for its object inter alia to provide a laser which does not have the above disadvantage, or at least to a much lesser degree, i.e. which has substantially no amplification ripple. The invention also has for its object to provide a method by which such a laser may be readily manufactured.

According to the invention, a laser of the kind mentioned in the opening paragraph is for this purpose characterized in that the second side face of said tapering portion encloses an angle with the perpendicular to the end face which lies between zero and 30°. The invention is based on the recognition first of all that said problem of a ripple occurring in the amplification is connected with a too high reflection. It is also based on the recognition that the reflection can be further reduced in that the reflection occurring between the active region and the third cladding layer is reduced. This is achieved in the laser according to the invention by giving the second side face an angle to the perpendicular to an end face which lies between 0° and 30°. This enlarges the region over which the active layer has a tapering shape. A result of this is that the difference in effective refractive index between the active region and the third cladding layer is reduced, so that the reflection therebetween is strongly reduced. Preferably, the angle last mentioned is chosen to lie between 0° and 10°, and in a preferred embodiment this angle is approximately 0°. Said reflection is particularly low in this case. The incoming or outgoing radiation is no longer perpendicular to an end face in the laser according to the invention, it is true, but this disadvantage may readily be eliminated in that, for example, a glass fiber used is positioned at an angle to an end face, for example an angle of approximately 35°. An amply sufficient coupling efficiency can thus be achieved in practice. An important additional advantage of a laser according to the invention is that both the first and the second side face of the tapering portion of the active region enclose only a (very) small angle with one another and with the perpendicular to the end face. This latter face corresponds to either the <01-1> or the equivalent <110> direction, or the <011> or the equivalent <−110> direction in III–V materials. Growing of a III–V material against a surface extending in said directions progresses somewhat differently for the two (groups of) directions. In the laser according to the invention, nothing or substantially nothing is experienced of said differences because both the first and the second side face extend (substantially) in the same direction. The laser according to the invention is thus particularly suitable for embodiments of the so-called buried hetero type. A (current-blocking) cladding layer is present in this type not only between the active region and an end face but also on either side of the active region.

In a major embodiment of a laser according to the invention, accordingly, the strip-shaped active region forms part of a strip-shaped mesa which also comprises the first and the second cladding layer, which coincides with the strip-shaped active region seen in projection, and which is surrounded by a further cladding layer which is current-blocking. Such a laser is of the so-called SIPBH (=Semi Insulating Planar Buried Hetero) type and is particularly suitable for use in a glass fiber communication system when constructed as a laser (amplifier). This modification of the laser may also be manufactured comparatively easily by MOVPE (=Metal Organic Vapor Phase Epitaxy), which is a very attractive technology.

In a particularly favorable modification of the latter embodiment, the strip-shaped mesa is bounded on either side by a fourth cladding layer which is current-blocking and forms a further strip-shaped mesa therewith which has a side face coinciding with the second side face and which is surrounded by the third cladding layer. The manufacture of this modification does comprise more steps than a process in which the third cladding layer is entirely provided directly around the strip-shaped mesa, but this is counteracted by an important advantage. Underetching and rounding of the tapering portion of the strip-shaped active region is avoided or limited thanks to the presence of the fourth cladding layer on either side of the strip-shaped mesa (i.e. on either side of the strip-shaped active region) when the second side face is formed by etching. Indeed, said rounding will be restricted to portions of the fourth cladding layer. Problems may arise there during growing of the third cladding layer because is that location the mask used during etching, which also serves as a mask in the (selective) application of the third cladding layer, projects comparatively far. The irregularities arising therefrom, such as air-filled pockets in the III–V crystal of the third cladding layer, however, will not be present in the radiation path provided the further mesa is sufficiently wide. As a result, the radiation pattern of a laser according to the invention is an optimum because it is not disturbed. Reference is also made here to the discussion of a method according to the invention given below by way of further explanation. Preferably, the further strip-shaped mesa does not become wider than one to ten times the width of the strip-shaped mesa. In this case the area to be grown during the application of the third cladding layer is still comparatively large, i.e. substantially the entire laser surface area. This has the advantage that the growing process of the third cladding layer can take place in a very controlled manner, which promotes inter alia the crystal quality and planeness of the third cladding layer.

In a laser according to the invention, preferably, the longitudinal axis of the strip-shaped active region encloses an angle with the end face which lies between 0° and 20° and which is preferably approximately 10°. On the one hand the reflection reduction at the end faces as a result of said angle is comparatively great with such angles, while on the other hand coupling of the radiation is still very well possible.

A laser according to the invention is preferably constructed from a semiconductor body in the InP/InGaAsP material system, while the end faces are provided with an anti-reflection layer. The laser is particularly suitable then for use as an amplifier in an optical communication system within the wavelength window from 1 to 1.6 μm.

A method of manufacturing a semiconductor diode laser according to the invention whereby a semiconductor layer structure is provided on a substrate with at least a first cladding layer of a first conductivity type, an active layer, and a second cladding layer of a second conductivity type opposed to the first, which cladding layers are provided with current supply means, while a strip-shaped active region is formed within the active layer so as to lie within two end faces such that the longitudinal axis of the strip-shaped active region encloses a small angle with the perpendicular to the end faces and at least one end of the strip-shaped active region is separated from an end face by a third cladding layer and is provided with a tapering portion, as seen in projection, such that a first side face thereof coincides with a side face of the portion of the strip-shaped active region which lies outside the tapering portion, and a second side face thereof encloses an acute angle with the perpendicular to the end face, is characterized according to the invention in that an angle is chosen for the acute angle which is at most 30°, preferably at most 10°, and preferably approximately 0°. A laser according to the invention is obtained thereby in a simple manner.

In a preferred embodiment of a method according to the invention, a strip-shaped region is formed in the active layer in a first manufacturing step, after which in a further manufacturing step the strip-shaped region is provided with the tapering portion constituting the strip-shaped active region by means of etching with the use of a mask. Preferably, the strip-shaped region is also formed by etching during the first step. Alternatively, however, it may be formed by, for example, selective deposition. The fact that the tapering portion is formed in a separate (etching) step achieves that this tapering portion of the strip-shaped active region has very plane side faces and a sharp tip. Were the strip-shaped active region formed, for example, in a single etching step, the tapering portion thereof would have curved side faces owing to underetching and no sharp tip, and the mask used would project comparatively far beyond the mesa in these locations. This is disadvantageous for a further growing process against the mesa, as was explained above.

In an important modification of a method according to the invention, a strip-shaped mesa is formed in the semiconductor layer structure, a fourth cladding layer which is current-blocking is provided on either side of the strip-shaped mesa, a further strip-shaped mesa is formed which encompasses the strip-shaped mesa and the adjoining fourth cladding layer, whereupon the further strip-shaped mesa is provided with a tapering end by means of etching with the use of a mask, a first side face of said end coinciding with a side face of the further strip-shaped mesa outside the tapering portion thereof and a second side face extending parallel to the perpendicular to an end face to be formed, and subsequently the third cladding layer is provided around the further strip-shaped mesa. The formation of the further strip-shaped mesa limits the underetching effect mentioned above still further, so that the second side face of the tapering portion of the strip-shaped active region is perfectly plane. Moreover, any underetching still present is shifted to outside the radiation path of the laser. This manufacture thus results in a substantially optimum laser.

BRIEF DESCRIPTION OF THE DRAWINGS

The invention will now be explained in more detail with reference to an embodiment and the accompanying drawing, in which.

DESCRIPTION OF THE PREFERRED EMBODIMENTS

Figure 1:
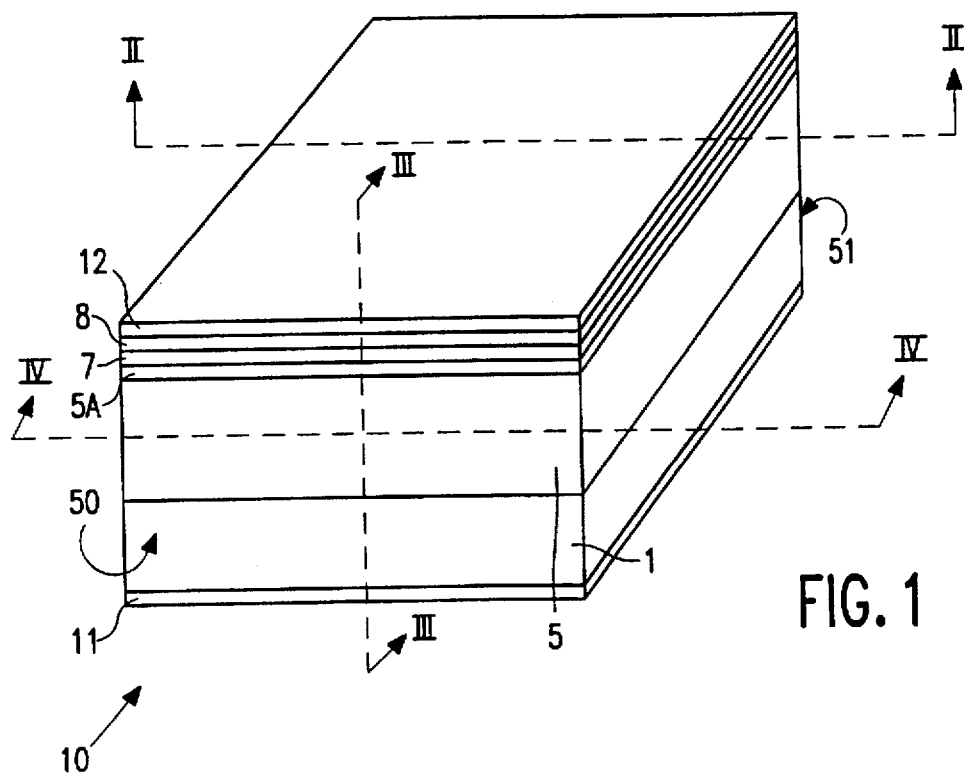
FIG. 1 shows a semiconductor diode laser according to the invention diagrammatically and in perspective view.

The Figures are diagrammatic and not drawn to scale, the dimensions in the thickness direction being particularly exaggerated for greater clarity. Corresponding parts have been given the same reference numerals as much as possible in the various Figures.

Figure 2:
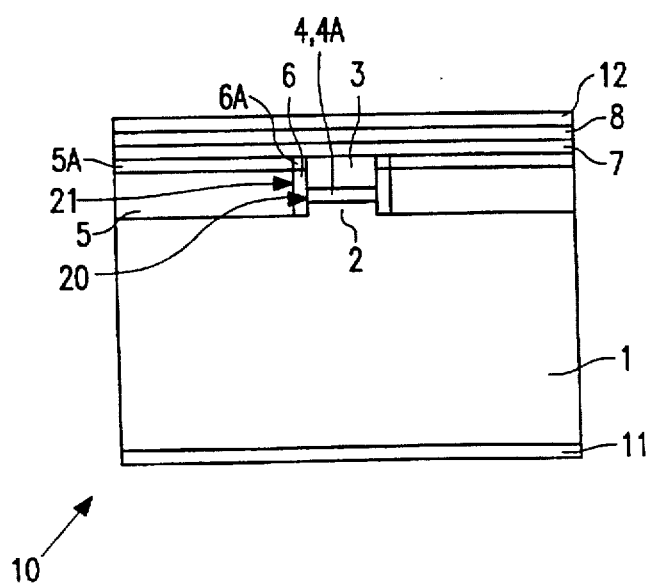
FIG. 2 shows the laser of FIG. 1 diagrammatically in a cross-section taken on the line II—II.
Figure 3:
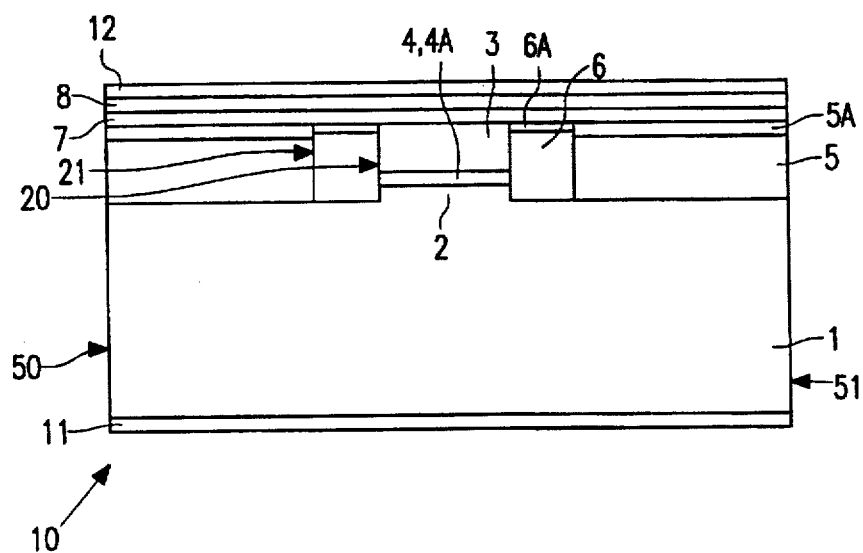
FIG. 3 shows the laser of FIG. 1 diagrammatically in a cross-section taken on the line III—III.
Figure 4:
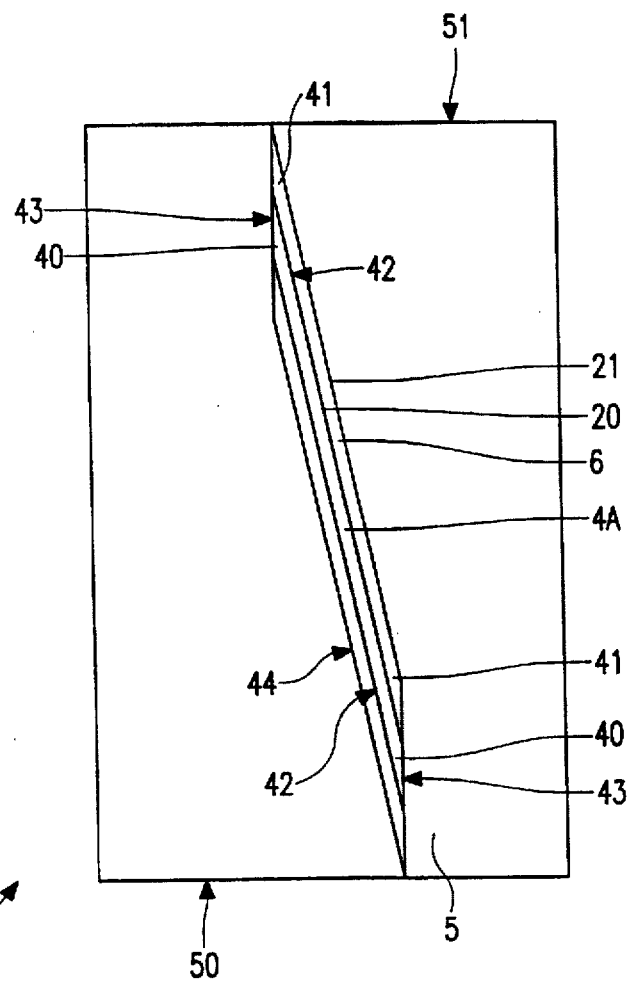
FIG. 4 shows the laser of FIG. 1 diagrammatically in a cross-section taken on the line IV—IV.
Figure 5:
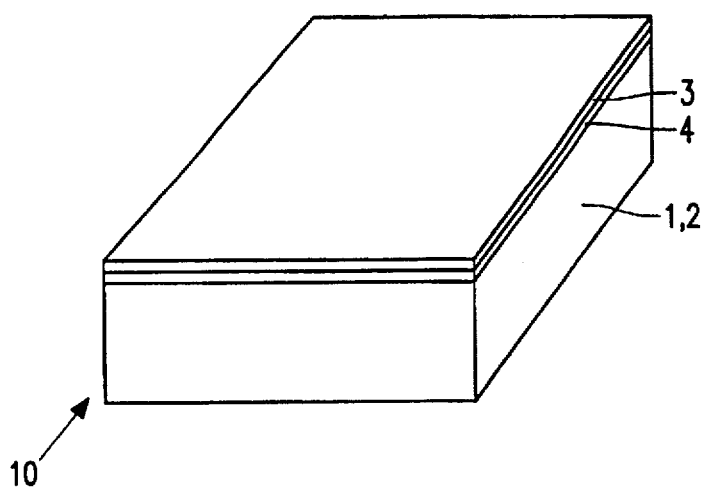
FIGS. 5 to 10 show the laser of FIG. 1 diagrammatically and in perspective view in consecutive stages of its manufacture by a method according to the invention.
Figure 6:
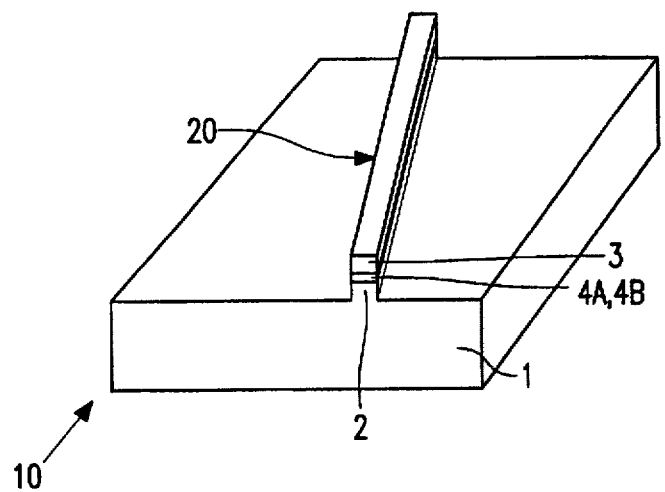
Figure 7:
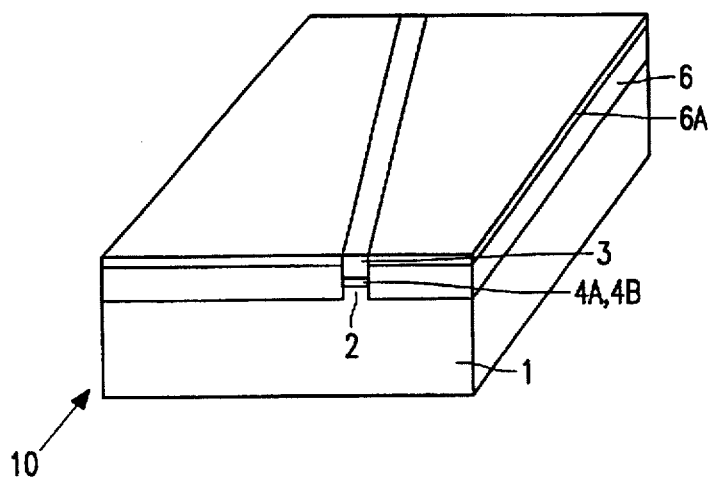
Figure 8:
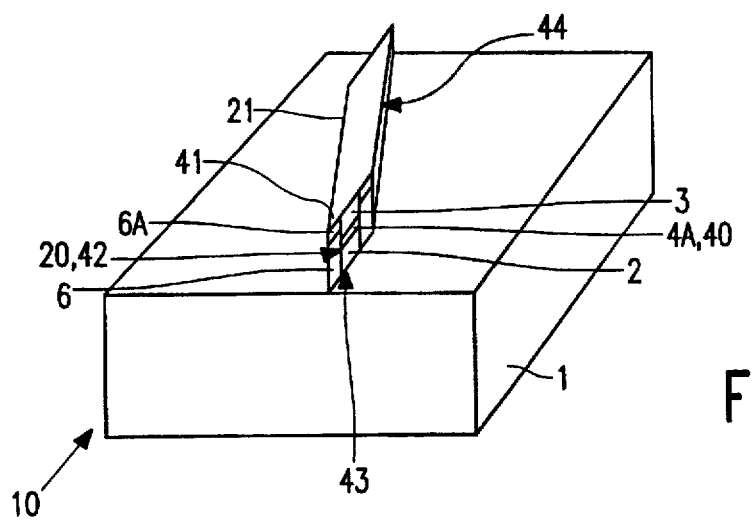
Figure 9:
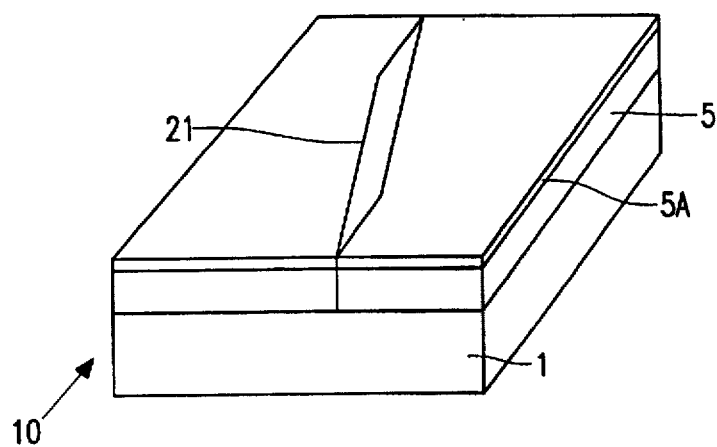
Figure 10:
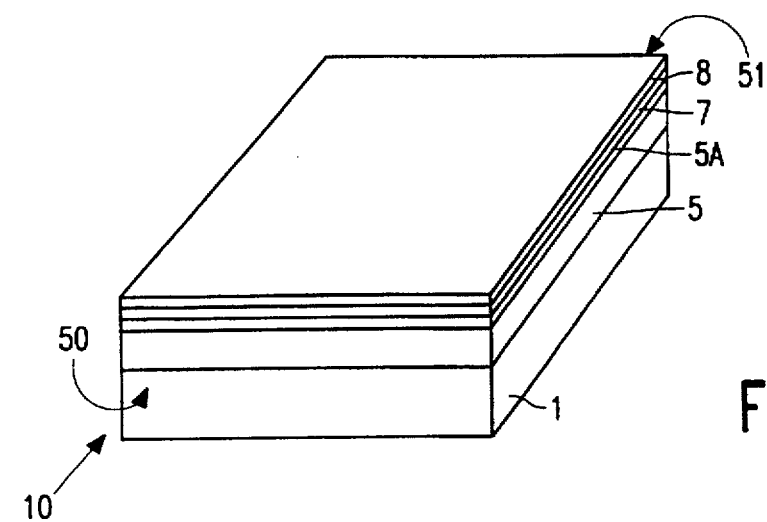

FIG. 1 shows a semiconductor diode laser according to the invention, here constructed as an amplifier, diagrammatically and in perspective view. FIGS. 2, 3 and 4 show the laser of FIG. 1 diagrammatically and in cross-sections taken on the lines II—II, III—III, and IV—IV, respectively. The laser (see FIG. 2) comprises a semiconductor body 10 with a substrate 1, in this example an n-type InP substrate with a thickness of approximately 100 μm and a doping concentration of $5 \times 10^{18}$ S at/cm$^3$ and a (001) orientation. A 1.5 μm thick portion 2 of the substrate 1 in this example acts as a first cladding layer 2 for an active layer 4 with a strip-shaped active region 4A of $In_{0.57}Ga_{0.43}As_{0.91}P_{0.09}$ ($\lambda$=1.55 μm) of 0.1 μm thickness. A second cladding layer 3 of p-type InP with a doping of $5 \times 10^{17}$ Zn at/cm$^3$ and a thickness of approximately 1 μm is disposed thereon. Electromagnetic radiation can be generated or amplified within the strip-shaped active region 4A by means of the pn junction formed between the cladding layers 2, 3, given a sufficient current strength in the forward direction. The cladding layers 2, 3 are for this purpose provided with current supply means 11, 12 in the form of metal layers 11, 12 usual for InP/InGaAsP. The strip-shaped active region 4A lies within a resonance cavity which is formed (see FIG. 4) between two parallel end faces 50, 51, has a longitudinal axis which encloses a small angle with the perpendicular to the end faces 50, 51, and is separated from the end faces 50, 51 by a third, current-blocking cladding layer 5 which is made of SI (=Semi Insulating) InP and is approximately 2.2 μm thick. The strip-shaped active region 4A further comprises a portion 40 which has a tapering shape seen in projection, of which a first side face coincides with a side face 42 of the strip-shaped active region 4A outside the tapering portion 40 thereof, and of which a second side face 43 encloses an acute angle with the perpendicular to the end faces 50, 51.

According to the invention, the second side face 43 of the tapering portion 40 of the strip-shaped active region 4A encloses an angle with the perpendicular to the end faces which lies between 0° and 30°, preferably between 0 and 10°, and preferably is, as in this example, approximately 0°. The result is that the strips-shaped active region 4A tapers strongly over a comparatively great distance. This implies that the step in the effective refractive index between the active region 4A and the third cladding layer 5, and thus the reflection therebetween, is substantially reduced. Given an angle of approximately 0°, said reflection, and thus the amplification ripple, is substantially an optimum. The radiation entering or leaving the laser then encloses an angle of, for example, 35° with the end faces 50, 51 but can still be satisfactorily coupled into a glass fiber (not shown). This renders the laser of this example particularly suitable for use in an optical communication system. Moreover, growing against said side faces 42, 43 is very uniform because both the first side face 42 and the second side face 43 of the strip-shaped active region 4A and of the tapering portion 40 thereof are sufficiently parallel to the <01-1> direction here. This strongly benefits the yield and quality of the laser if the latter is, for example, of the buried hetero type, as in the present case.

The strip-shaped active region 4A (see FIG. 2) of the laser in this example, which is of the SIPBH type mentioned earlier, forms part of a strip-shaped mesa 20 which further comprises the two cladding layers 2, 3, which coincides with the strip-shaped active region 4A seen in projection, and which is surrounded by a further cladding layer, here a fourth cladding layer 6 of SI-InP with a thickness of more than 2 μm with which the mesa 20 forms a further strip-shaped mesa 21 which has a side face 43 which coincides with the second side face 43 and which is surrounded by the third cladding layer 5. In this example, the third and fourth cladding layers 5, 6 comprise respective thin portions 5A, 6A of n-type InP, approximately 0.3 μm thick in this case. A fifth cladding layer 7 of p-type InP and 0.5 μm thickness is present thereon, extending over the entire laser. A contact layer 8 of p-type $In_{0.57}Ga_{0.43}As_{0.91}P_{0.09}$ with a doping of $1 \times 10^{19}$ Zn at/cm$^3$ and 0.5 μm thick is present on the fifth cladding layer.

The length of the mesas 20 and 21 is 820 μm, and the respective widths of the mesas 20 and 21 are 2 to 3 μm and 10 μm. The dimensions of the semiconductor body 10 are 850×300×100 μm$^3$. The angle enclosed by the longitudinal axis of the strip-shaped active region 4A and the perpendicular to the end faces 50, 51 lies between 0° and 20° and is preferably approximately 10°, as in the present example. The above implies that the length of the second side face 43 of the tapering portion 40 of the active layer 4A is between 11.5 and 17.5 μm, depending on the width of the mesa 20. The end faces 50, 51 in this example are provided with a ¼λ anti-reflection layer (not shown) made from a silicon oxynitride with a refractive index of 1.78.

FIGS. 5 to 10 show the laser of FIG. 1 diagrammatically and in perspective view in consecutive stages of its manufacture by a method according to the invention. Manufacture starts (see FIG. 5) with the formation of a semiconductor body 10 comprising an approximately 350 μm thick (001) substrate 1 and having two cladding layers 2, 3 between which an active layer 4 is present. The first cladding layer 2 is formed here by an upper portion 2 of the substrate 1, the other layers 3, 4 are provided by epitaxy, MOVPE in this case. The chosen materials, thicknesses, doping levels, and compositions are as discussed with reference to the first four Figures.

After removal from the growing apparatus, a strip-shaped mesa 20 (see FIG. 6) is formed by means of a strip-shaped mask (not shown) of, for example, SiO$_2$ and an etching process, which mesa has the same shape as the mask and encloses a small angle, here an angle of 10°, with the <0.1-1> direction in this case and extends down into the substrate 1. Further information on the etching process can be found in U.S. Pat. No. 5,266,518. A strip-shaped active region 4A to be formed is part of this mesa 20. After renewed placement in the growing apparatus (see FIG. 7), a fourth cladding layer 6, 6A is selectively applied on either side of the mesa 20. After removal from the growing apparatus, a further strip-shaped mesa 21 (see FIG. 8) is formed by means of a further strip-shaped mask (not shown), for example made of SiO$_2$, and by etching, which mesa has the same shape as the further mask, whereby the strip-shaped active region 4A is given its final shape. The etching process is again described in the US Patent cited above. The shape of the further mask is such that an end of the strip-shaped active region 4A is provided with a tapering portion 40 of which a first side face 42 coincides with a side face 42 of the strip-shaped active region 4A outside the tapering portion 40 thereof, and a second side face 43 of the tapering portion 40 is given an acute angle relative to the perpendicular to the end faces 50, 51.

According to the invention, the acute angle is chosen to lie between 0° and 30°, preferably between 0° and 10°, and preferably to be approximately 0°, as in the present example. Preferably, as in this example, the strip-shaped active region 4A is formed in two separate manufacturing steps: a first step in this example in which a strip-shaped region 4B which is still uninterrupted in longitudinal direction is formed in the active layer 4 (see FIG. 6), during the formation of the mesa 20 in this case, and a second step in which the strip-shaped active region 4B is provided with the tapering portion 40 by means of the further mask and etching, whereby the strip-shaped active region 4A is formed (see FIG. 8). Rounding of the tapering portion 40 through underetching is prevented or at least limited thereby as compared with a situation in which the strip-shaped active region 4A is formed in a single step. This is true in particular when a tapering portion 40 is formed which has a very sharp tip, as in the present invention. The presence of the fourth cladding layer 6 on either side of the strip-shaped active region 4A (see FIGS. 7 and 8) also contributes to the prevention of underetching and rounding during the formation of the second side face 43 (see FIG. 8), and thus to the prevention of an excessive overhang of the further strip-shaped mask beyond the further mesa 21 to be formed. Any irregularities in the material to be grown against the further mesa 21 in a later phase are counteracted thereby. Should any irregularities arise, these will be present at the area of the fourth cladding layer 6, and accordingly not at the area of the strip-shaped active region 4A, i.e. not in the radiation path of the laser.

The product is removed from the growing apparatus and the masks used for forming the mesas 20, 21 are removed, whereupon a fifth cladding layer 7 and a contact layer 8 are provided in a final growing process. Then the substrate thickness is reduced to approximately 100 μm by grinding, usual metal layers 11, 12 are provided, and the end faces 50, 51 are formed by repeated cleaving and are provided with anti-reflection coatings. The perpendicular of the end faces 50, 51 was chosen to be the <0,1,−1> direction in the present example, which is a preferred direction. Good results are also obtained, however, when the <0,1,1> direction is chosen for this perpendicular. A laser (amplifier) according to the invention has thus been obtained which is ready for use. When a grating is provided within the resonant cavity in the vicinity of the active layer 4A, the resulting laser is of the DFB (=Distributed Feed Back) type.

The invention is not limited to the embodiments given since many modifications and variations are possible to those skilled in the art within the scope of the invention. Thus thicknesses, semiconductor materials, compositions, or conductivity types other than those mentioned in the examples may be used. It is also possible to use a semi-insulating substrate. It is especially noted that the invention may also be applied to the material systems GaAs/AlGaAs, InGaP/InAlGaP, and InP/AlGaInAs. The mesa structures used in the examples were all manufactured by etching, but they may alternatively be manufactured by a selective growing process.

The formation of the further mesa as in the present example may also be omitted. Manufacture is much simpler in that case owing to the omission of a number of steps, among them a growing process. The formation of the strip-shaped active region 4A according to the invention should preferably take place in two separate steps also in that case, however, because the advantage thereof discussed above is still obtained then.

It is further noted that the invention is not limited to the SIPBH laser described. The use of alternative current-blocking cladding layers is possible. Thus a pnp triple layer structure may be used instead of an SI layer, comprising a reverse-bias, i.e. current-blocking pn junction. The invention may also be used to advantage in other index-guided lasers such as those of the, possibly buried, ridge type. The same is true for lasers of the gain-guided type, such as an oxide strip or proton bombarded laser.

It is finally noted that the growing process(es) used in a method according to the invention may comprise besides MOVPE also other processes such as LPE (=Liquid Phase Epitaxy), VPE (=Vapor Phase Epitaxy), or MBE (=Molecular Beam Epitaxy), or combinations thereof. Instead of the wet-chemical etching processes referred to, RIE (Reactive Ion Etching) may also be advantageously utilized.

What is claimed is:

1. A semiconductor diode laser with a semiconductor body of III-V semiconductor materials comprising a substrate and an overlaying semiconductor layer structure with at least a first cladding layer of a first conductivity type, a second cladding layer of a second conductivity type opposed to the first, said cladding layers being provided with current supply means; and between the first and second cladding layers an active layer and a pn junction which, given a sufficient current strength in the forward direction, is capable of amplifying or generating electromagnetic radiation in a strip-shaped active region which forms part of the active layer, which lies within a resonance cavity formed between two parallel end faces, the longitudinal axis of said resonance cavity enclosing a small angle with the perpendicular to the end faces, and which has at least one end which is situated adjacent an end face and is separated from said end face by a third cladding layer which is preferably current-blocking and which is provided with a tapering portion, as seen in projection, of which a first side face coincides with a side face of the strip-shaped active region outside the tapering portion and of which a second side face encloses an acute angle with the perpendicular to the end face, characterized in that the second side face of said tapering portion encloses an angle with the perpendicular to the end face which lies between 0° and 30°.

2. A semiconductor diode laser as claimed in claim 1, characterized in that the second side face of the tapering portion of the strip-shaped active region encloses an angle with the perpendicular to the end face which lies between 0° and 10°, and which is preferably approximately 0°.

3. A semiconductor diode laser as claimed in claim 2, characterized in that the strip-shaped active region forms part of a strip-shaped mesa which also comprises the first and the second cladding layer, which coincides with the strip-shaped active region seen in projection, and which is surrounded by a further cladding layer which is current-blocking.

4. A semiconductor diode laser as claimed in claim 2, characterized in that the angle between the longitudinal axis of the strip-shaped active region and the end faces lies between 0° and 20° and is preferably approximately 10°.

5. A semiconductor diode laser as claimed in claim 2, characterized in that the semiconductor body comprises materials of the InP/InGaAsP material system, and the end faces are provided with an anti-reflection layer.

6. A semiconductor diode laser as claimed in claim 1, characterized in that the strip-shaped active region forms part of a strip-shaped mesa which also comprises the first and the second cladding layer, which coincides with the strip-shaped active region seen in projection, and which is surrounded by a further cladding layer which is current-blocking.

7. A semiconductor diode laser as claimed in claim 6, characterized in that the strip-shaped mesa is bounded on either side by a fourth cladding layer which is current-blocking and forms a further strip-shaped mesa therewith which has a side face coinciding with the second side face and which is surrounded by the third cladding layer.

8. A semiconductor diode laser as claimed in claim 7, characterized in that the angle between the longitudinal axis of the strip-shaped active region and the end faces lies between 0° and 20° and is preferably approximately 10°.

9. A semiconductor diode laser as claimed in claim 7, characterized in that the semiconductor body comprises materials of the InP/InGaAsP material system, and the end faces are provided with an anti-reflection layer.

10. A semiconductor diode laser as claimed in claim 6, characterized in that the angle between the longitudinal axis of the strip-shaped active region and the end faces lies between 0° and 20° and is preferably approximately 10°.

11. A semiconductor diode laser as claimed in claim 6, characterized in that the semiconductor body comprises materials of the InP/InGaAsP material system, and the end faces are provided with an anti-reflection layer.

12. A semiconductor diode laser as claimed in claim 1, characterized in that the angle between the longitudinal axis of the strip-shaped active region and the end faces lies between 0° and 20° and is preferably approximately 10°.

13. A semiconductor diode laser as claimed in claim 12, characterized in that the semiconductor body comprises materials of the InP/InGaAsP material system, and the end faces are provided with an anti-reflection layer.

14. A semiconductor diode laser as claimed in claim 1, characterized in that the semiconductor body comprises materials of the InP/InGaAsP material system, and the end faces are provided with an anti-reflection layer.

* * * * *